United States Patent
Do et al.

(10) Patent No.: US 8,372,746 B2
(45) Date of Patent: Feb. 12, 2013

(54) ELECTRODE OF SEMICONDUCTOR DEVICE AND METHOD FOR FABRICATING CAPACITOR

(75) Inventors: Kwan-Woo Do, Gyeonggi-do (KR); Kee-Jeung Lee, Gyeonggi-do (KR); Kyung-Woong Park, Gyeonggi-do (KR); Jeong-Yeop Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 204 days.

(21) Appl. No.: 12/824,670

(22) Filed: Jun. 28, 2010

(65) Prior Publication Data
US 2011/0128668 A1 Jun. 2, 2011

(30) Foreign Application Priority Data
Nov. 30, 2009 (KR) .................. 10-2009-0117424

(51) Int. Cl.
*H01L 21/44* (2006.01)
(52) U.S. Cl. ...................... 438/653; 438/648
(58) Field of Classification Search .................. 438/648, 438/653
See application file for complete search history.

(56) References Cited

U.S. PATENT DOCUMENTS

| 2008/0121963 A1* | 5/2008 | Govindarajan | 257/310 |
| 2008/0149980 A1 | 6/2008 | Govindarajan | |
| 2008/0290417 A1* | 11/2008 | Caubet et al. | 257/369 |
| 2010/0081275 A1* | 4/2010 | Ishizaka et al. | 438/653 |
| 2011/0128667 A1* | 6/2011 | Do et al. | 361/305 |

FOREIGN PATENT DOCUMENTS

| KR | 1020000053483 | 8/2000 |
| KR | 100791071 | 1/2008 |
| KR | 1020080060609 | 7/2008 |

OTHER PUBLICATIONS

Notice of Allowance issued from Korean Intellectual Property Office on Oct. 28, 2011.
Notice of Preliminary Rejection issued from Korean Intellectual Property Office on Jun. 23, 2011.

\* cited by examiner

*Primary Examiner* — Bradley K Smith
(74) *Attorney, Agent, or Firm* — IP & T Group LLP

(57) ABSTRACT

An electrode of a semiconductor device includes a TiCN layer and a TiN layer. A method for fabricating an electrode of a semiconductor device includes preparing a substrate, forming a TiCN layer, and forming a TiN layer.

18 Claims, 4 Drawing Sheets

ELECTRODE OF SEMICONDUCTOR DEVICE AND METHOD FOR FABRICATING CAPACITOR

CROSS-REFERENCE TO RELATED APPLICATIONS

The present application claims priority of Korean Patent Application No. 10-2009-0117424, filed on Nov. 30, 2009, which is incorporated herein by reference in its entirety.

BACKGROUND OF THE INVENTION

Exemplary embodiments of the present invention relate to a semiconductor fabricating technology, and more particularly, to an electrode of a semiconductor device and a method for fabricating a capacitor.

In a semiconductor DRAM fabrication process, as structural scale-down is accelerated so as to increase the output per wafer, a capacitor incorporated in the DRAM has been structurally miniaturized, and a capacitance under which the device can operate has been decreased.

In this situation, a high-k dielectric layer is used to increase the capacitance. However, a high-k dielectric layer can show leakage current characteristics deteriorating due to a low band gap. In order to address this, an electrode having a high work function is sought after in the art.

SUMMARY OF THE INVENTION

An embodiment of the present invention is directed to an electrode of a semiconductor device and a method for fabricating a capacitor, which can fabricate an electrode with a high work function.

In accordance with an embodiment of the present invention, an electrode of a semiconductor device includes a TiCN layer and a TiN layer.

In accordance with another embodiment of the present invention, a method for fabricating an electrode of a semiconductor device includes preparing a substrate, forming a TiCN layer, and forming a TiN layer.

In accordance with another embodiment of the present invention, a capacitor includes: a first electrode; a dielectric layer; and a second electrode, wherein at least one of the first and second electrodes includes a TiCN layer and a TiN layer.

In accordance with another embodiment of the present invention, a method for fabricating a capacitor includes forming a first electrode, forming a dielectric layer, and forming a second electrode on the dielectric layer, wherein at least one of the first and second electrodes includes a TiCN layer and a TiN layer.

DESCRIPTION OF SPECIFIC EMBODIMENTS

Figure 1:
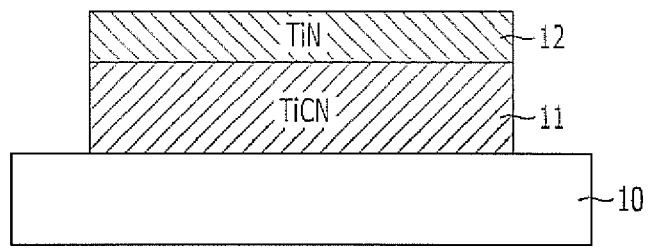
FIG. 1 is a cross-sectional view illustrating an electrode of a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will fully enable one of ordinary skill in the art to practice the invention without undue experimentation. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention relates to an electrode of a semiconductor device and a method for fabricating a capacitor. In the present invention, due to the fact that the stack structure of a TiCN (titanium carbon nitride) layer and a TiN (titanium nitride) layer is used as the electrode of a semiconductor device, a high work function can be achieved. Therefore, even when a high-k dielectric layer is used in order to secure the capacitance of a capacitor, leakage current characteristics can be improved. A method for fabricating the electrode having the stack structure of a TiCN layer and a TiN layer, for such a purpose, is described below.

FIG. 1 is a cross-sectional view illustrating an electrode of a semiconductor device in accordance with a first embodiment of the present invention.

Referring to FIG. 1, an electrode having a stack structure of a TiCN layer 11 and a TiN layer 12 is formed over a substrate 10. For example, the electrode is used as at least one electrode selected from the gate electrode of a transistor or a diode, a bit line electrode, the bottom electrode of a capacitor, and or the top electrode of the capacitor.

Since the TiCN layer 11 which is realized by doping carbon into a titanium nitride layer has a work function of 4.8 eV, the height of a Schottky barrier can be increased, and accordingly, leakage current characteristics can be improved.

Moreover, due to the fact that the stack structure of the TiCN layer 11 and the TiN layer 12 is used, the degradation of electrical characteristics due to oxidation of the TiCN layer 11 may be prevented. That is to say, in the case where the TiCN layer 11 is independently used, due to the characteristics of TiCN, the film density decreases compared with a titanium nitride layer. Therefore, as the TiCN layer 11 is abruptly oxidated when exposed to air after being deposited, $TiO_xC_yN$ (x and y are natural numbers), which has the phase of a titanium oxide (TiO), is formed on the surface of the TiCN layer 11. As a consequence, an effective oxide layer thickness Tax decreases, and electrical characteristics are degraded, These concerns can be alleviated by stacking the TiN layer 12 on the TiCN layer 11.

The TiCN layer 11 and the TiN layer 12 can be formed in situ in the same chamber. The TiN layer 12 can be formed in such a manner that the TiN layer 12 is stacked on the TiCN layer 11 or plasma processing is conducted for the TiCN layer 11 so that a partial thickness of the TiCN layer 11 is changed into the TiN Layer 12 of a high density, which is described below.

Since the electrode is formed to have the stack structure of the TiCN Layer 11 which has a high work function and the TiN layer 12 which has a high film density, the natural oxidation of the TiCN layer 12 by air in the atmosphere can be inhibited, whereby the electrical characteristics of the TiCN layer 11 can be maintained. Accordingly, the height of the Schottky barrier can be increased, and the leakage current characteristics can be improved.

Hence, the electrode in accordance with the embodiment of the present invention can be used for the gates of transistors or diodes and electrode materials for contacts, etc., which need electrodes having a high work function. As a result, since a high-k dielectric layer can be applied due to the high work function, the leakage current characteristics are improved, and, when the electrode is used as the electrode of a capacitor, sufficient capacitance is secured.

Figure 2A:
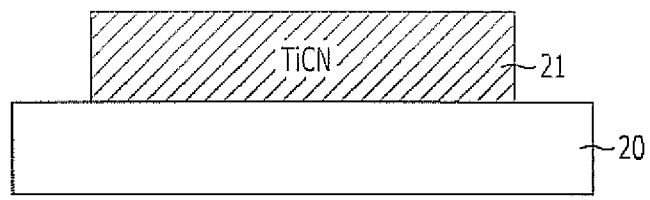
FIGS. 2A and 2B are cross-sectional views illustrating the processes of a method for fabricating an electrode of a semiconductor device in accordance with a second embodiment of the present invention.
Figure 2B:
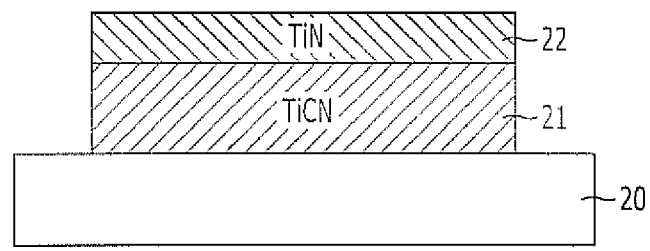

FIGS. 2A and 2B are cross-sectional views illustrating the processes of a method for fabricating an electrode of a semiconductor device in accordance with a second embodiment of the present invention.

Referring to FIGS. 2A and 2B, a TiCN layer 21 is formed over a substrate 20, and a TiN layer 22 is stacked an the TiCN layer 21. The TiCN layer 21 and the TiN layer 22 are formed in situ in the same chamber. Both of the TiCN layer 21 and the TiN layer 22 are formed through atomic layer deposition. The atomic layer deposition for forming the TiCN layer 21 and the TiN layer 22 will be described below with reference to FIG. 4.

Figure 3A:
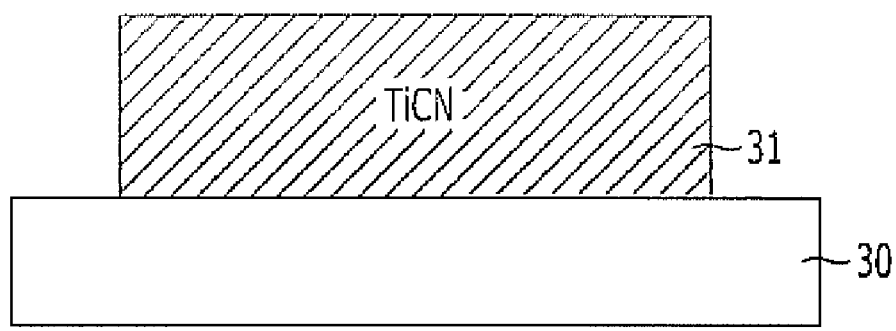
FIGS. 3A and 3B are cross-sectional views illustrating the processes of a method for fabricating an electrode of a semiconductor device in accordance with a third embodiment of the present invention.
Figure 3B:
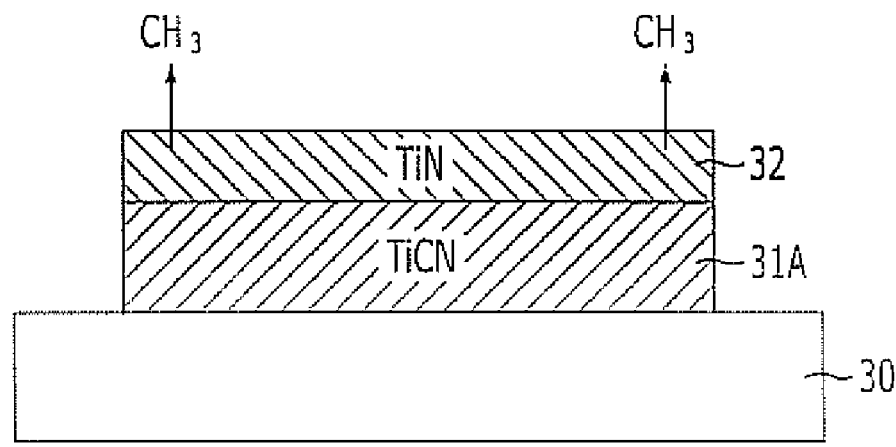

FIGS. 3A and 3B are cross-sectional views illustrating the processes of a method for fabricating an electrode of a semiconductor device in accordance with a third embodiment of the present invention.

Referring to FIGS. 3A and 3B, a TiCN layer 31 is formed on a substrate 30, and by conducting plasma processing in situ for the TiCN layer 31 and removing the $CH_3$ group contained in the TiCN layer 31, a portion of the TiCN layer 31 is changed into a TiN layer 32. Accordingly, a structure in which the TiN layer 32 is stacked on the TiCN layer 31 is achieved. The reference numeral 31A denotes the TiCN layer after the portion of the TiCN layer 31 is changed into the TiN layer 32. The formation of the TiCN layer 31 and the formation of the TiN layer 32 by the plasma processing are conducted through atomic layer deposition. The atomic layer deposition for forming the TiCN layer 31 and the TiN layer 32 will be described below with reference to FIG. 4.

Figure 4:
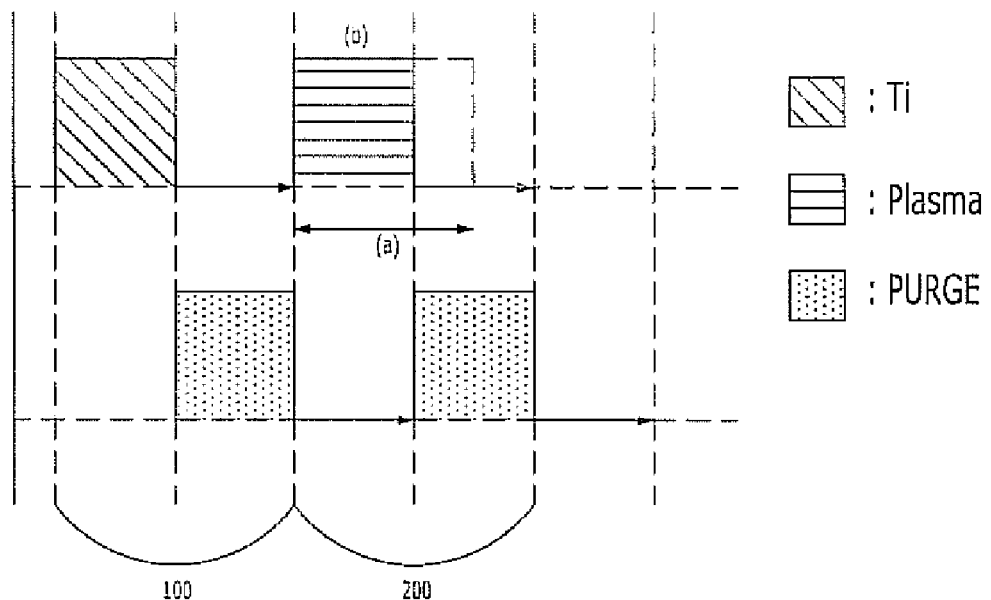
FIG. 4 is a timing diagram of atomic layer deposition adopted in the methods in accordance with the second and third embodiments of the present invention.

FIG. 4 is a timing diagram of atomic layer deposition adopted in the methods in accordance with second and third embodiments of the present invention.

Atomic layer deposition (ALD) is a method in which a plurality of single atomic layers are sequentially deposited by sequentially introducing a source material and a reactive material into a chamber and purging residues.

While the atomic layer deposition (ALD) belongs to a deposition method using chemical reactions such as chemical vapor deposition (CVD), the atomic layer deposition (ALD) is distinguished from the chemical vapor deposition (CVD) in that respective reaction sources are not mixed in the chamber and are flowed as a pulse one by one. For example, the atomic layer deposition is conducted in the sequence of source material introducing, purging, reactive material introducing, and purging. For example, after introducing the source material and inducing chemical adsorption, the unreacted source material remaining in the chamber is purged using an inert gas. Then, as the reactive material is introduced, reaction occurs between the source material and the reactive material, whereby an atomic layer is deposited. Finally, after the source material and the reaction material react with each other, the reactive material remaining in the chamber and reaction byproducts are purged.

In the atomic layer deposition (ALD) conducted as described above, by using a surface reaction mechanism, not only is a stable thin film realized, but also a uniform thin film. Also, due to the fact that the source material and the reactive material are separately and sequentially introduced and purged, the generation of particles by gas phase reaction is minimized/reduced when compared to the chemical vapor deposition (CVD).

As shown in FIG. 4, the TiCN layer and the TiN layer are formed through atomic layer deposition. The TiCN layer is formed through repeating A (A is a natural number) times a unit cycle (composed of a titanium organic source introducing step and a purging step) designated by the reference numeral 100, and the TiN layer is formed through repeating B (B is a natural number) times a unit cycle (composed of a plasma introducing step and a purging step) designated by the reference number 200 on the TiCN layer formed in through repeating the unit cycle 100 the A times, thereby changing a portion of TiCN into TiN, or through repeating C(C is a natural number) times unit cycles (composed of the titanium organic source introducing step, the purging step, the plasma introducing step and the purging step) designated by the reference numerals 100 and 200.

Describing a method for forming the TiCN layer, first, in the titanium organic source introducing step, a titanium organic source is supplied into the chamber in which a substrate is placed to be deposited with a titanium nitride layer. By supplying the titanium organic source, the titanium organic source is adsorbed to the surface of the substrate. As the titanium organic source, a titanium source involving a methylamino group can be used. Any one or more selected from the group consisting of TDMAT [tetrakis (dimethylamino) titanium], TEMAT [tetrakis (ethylmethylamino) titanium], and TDEAT [tetrakis (diethylamino) titanium] is used.

The substrate to be deposited with the titanium nitride layer can include a silicon substrate (Si), a silicon oxide layer ($SiO_2$), a metallic layer, or a high-k dielectric layer. The titanium nitride layer including carbon is specifically used as any one selected among a gate electrode, a bit line electrode, the bottom electrode of a capacitor, or the top electrode of the capacitor. A metal organic atomic layer deposition process is conducted specifically at a temperature using only thermal adsorption, more specifically at a temperature of 250° C. to 500° C. This is because the titanium organic source is not likely to be adsorbed to the surface of the substrate if the deposition temperature is less than 250° C. and the substrate is likely to be damaged by a high temperature if the deposition temperature is greater than 500° C.

In the purging step, the residual titanium organic source remaining after the adsorption reaction is removed. An inert gas which does not react with the titanium organic source is used as a purge gas. At least any one inert gas selected from the group consisting of $N_2$, Ar and He can be used. The purging step is conducted for 1 to 10 seconds using the purge gas having an amount of 100 sccm to 10,000 sccm.

As described above, the TiCN layer can be formed by repeating A times the unit cycle 100 composed of the titanium organic source introducing step and the purging step. In the case where C and N are contained in the titanium organic source, the titanium nitride layer containing carbon can be formed even without conducting nitrogen plasma processing. In the case where nitrogen is not contained in the titanium organic source, the TiCN layer can be formed by conducting a reactive gas introducing step using a nitrogen gas and a purging step although not shown in a drawing.

The TiN layer can be formed in at least two ways. One way is to change a partial thickness of the TiCN layer into the TiN layer, and the other way is to deposit the TiN layer onto the TiCN layer.

First, in the way of changing a partial thickness of the TiCN to layer into the TiN layer, the unit cycle 200 composed of the plasma introducing step and the purging step is conducted sometimes multiple times on the TiCN layer formed as described above.

The plasma introducing step is conducted on the TiCN layer formed as described above. The plasma introducing step can be conducted as direct plasma processing or remote plasma processing.

In the embodiment of the present invention, the remote plasma processing is now described. By using the remote plasma processing, the substrate may be substantially prevented from being physically damaged by plasma. As a gas for generating plasma, any one or more selected from the group consisting of $N_2$, $H_2$, and $NH_3$ is used. In order to remove the carbon contained in the TiCN layer, specifically, power of at least 1,000 W is applied.

By controlling the plasma processing step, an amount of carbon removed from the TiCN layer can be controlled, and accordingly, the thickness of the TiN layer can be controlled. To this end, a plasma processing time (a) and a power (b) are controlled. Specifically, the power (d) equal to or greater than 1,000 W is used, and the processing time (a) is determined to a time during which a minimum thickness of TiN layer for avoiding the natural oxidation of the TiCN layer is formed. The minimum thickness of the TiN layer for avoiding the natural oxidation of the TiCN layer is at least 20 Å.

Finally, the purging step is a step in which reaction byproducts and the reactive material remaining after reaction are purged. In the purging step, an inert gas is used as a purge gas. At least any one inert gas selected from the group consisting of $N_2$, Ar and He can be used. The purging step is conducted for 1 to 10 seconds using the purge gas having an amount of 100 sccm to 10,000 sccm.

In the way of stacking the TiN layer on the TiCN layer, the unit cycles 100 and 200 composed of the titanium organic source introducing step, the purging step, the plasma introducing step and the purging step are repeated C(C is a natural number) times.

The titanium organic source introducing step, the purging step, the plasma introducing step and the purging step are implemented in a manner as described above.

Figure 5A:
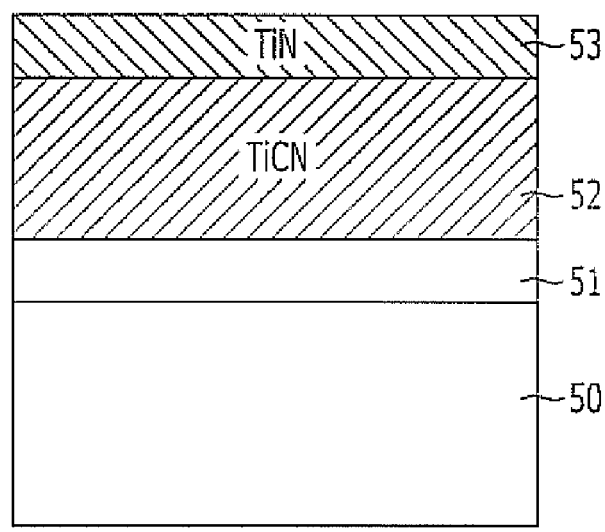
FIGS. 5A to 5C are cross-sectional views illustrating structures of a capacitor having a titanium nitride layer as an electrode in accordance with a fourth embodiment of the present invention.
Figure 5B:
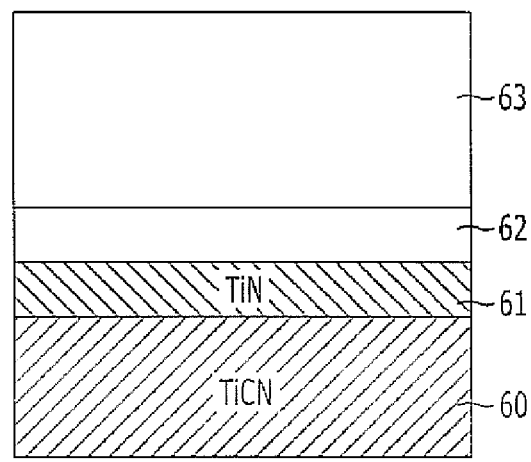
Figure 5C:
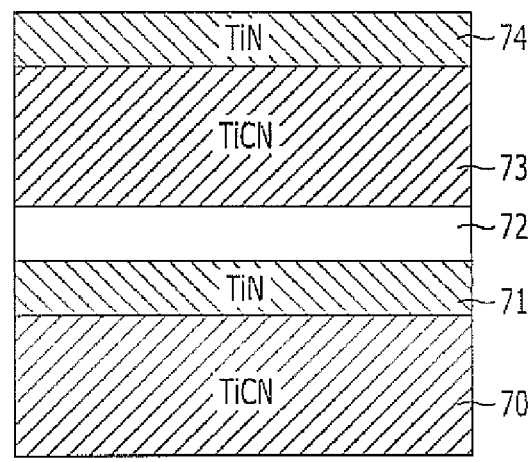

FIGS. 5A to 5C are cross-sectional views illustrating structures of a capacitor having a titanium nitride layer as an electrode in accordance with a fourth embodiment of the present invention. While bottom electrodes in the embodiment of the present invention are shown as a flat plate type for illustration purposes, the embodiments of the present invention are not limited to such a flat plate type bottom electrode, and instead, the bottom electrode can be any type selected from the group consisting of a concave type, a cylinder type, and a pillar type.

Referring to FIG. 5A, in a capacitor in which a bottom electrode 50, a dielectric layer 51 and a top electrode 52 and 53 are stacked, the top electrode 52 and 53 is formed as an electrode which has a stack structure of a TiCN layer 52 and a TiN layer 53. Specifically, the top electrode 52 and 53 can be formed through atomic layer deposition as shown in FIG. 4.

The dielectric layer 51 can include a high-k dielectric layer. For example, the dielectric layer 51 includes at least one high-k dielectric layer selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, $HfSiON$, $TiO_2$, $AlTiO_2$, $SrTiO_3$ and $BaSrTiO_3$.

Referring to FIG. 5B, in a capacitor in which a bottom electrode 60 and 61, a dielectric layer 62 and a top electrode 63 are stacked, the bottom electrode 60 and 61 is formed as an electrode which has a stack structure of a TiCN layer 60 and a TiN layer 61, Specifically, the bottom electrode 60 and 61 can be formed through atomic layer deposition as shown in FIG. 4.

The dielectric layer 62 can include a high-k dielectric layer. For example, the dielectric layer 62 includes at least one high-k dielectric layer selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, $HfSiON$, $TiO_2$, $AlTiO_2$, $SrTiO_3$ and $BaSrTiO_3$.

Referring to FIG. 5C, in a capacitor in which a bottom electrode 70 and 71, a dielectric layer 72 and a top electrode 73 and 74 are stacked, the bottom electrode 70 and 71 and the top electrode 73 and 74 are formed as electrodes which have stack structures of TiCN layers 70 and 73 and TiN layers 71 and 74. Specifically, the bottom electrode 70 and 71 and the top electrode 73 and 74 are formed through atomic layer deposition as shown in FIG. 4.

The dielectric layer 72 can include a high-k dielectric layer. For example, the dielectric layer 72 includes at least one high-k dielectric layer selected from the group consisting of $ZrO_2$, $ZrSiO_2$, $ZrTiO_3$, $ZrYO_2$, $ZrLaO_2$, $ZrAlO_2$, $HfO_2$, $HfSiO_2$, $HfYO_2$, $HfAlO_2$, $HfSiON$, $TiO_2$, $AlTiO_2$, $SrTiO_3$ and $BaSrTiO_3$.

As discussed above, in the electrode of a semiconductor device and the method for fabricating a capacitor in accordance with the exemplary embodiments of the present invention, since a TiCN layer having a high work function and a TiN layer having a high film density are stacked, the capacitance of a capacitor can be secured, and leakage current characteristics can be improved when a high-k dielectric layer is used.

While the present invention has been described with respect to the specific embodiments, it will be apparent to those skilled in the art that various changes and modifications may be made without departing from the spirit and scope of the invention as defined in the following claims and their equivalents.

What is claimed is:

1. A method for fabricating an electrode of a semiconductor device, comprising:
   preparing a substrate;
   forming a TiCN layer; and
   forming a TiN layer,
   wherein the TiN layer is formed by partially changing the TiCN layer into the TiN layer.

2. The method of claim 1, wherein the TiCN layer and the TiN layer are formed in situ in the same chamber.

3. The method of claim 1, wherein the TiCN layer and the TiN layer are formed through atomic layer deposition.

4. The method of claim 3, wherein the atomic layer deposition is conducted at a temperature at which thermal adsorption can be implemented.

5. The method of claim 3, wherein the atomic layer deposition is conducted at a temperature of 250° C. to 500° C.

6. The method of claim 1, wherein the forming of the TiCN layer comprises:
introducing a titanium organic source; and
purging,
wherein the introducing of the titanium organic source and the purging are repeated.

7. The method of claim 6, wherein the titanium organic source includes at least one selected from the group consisting of TDMAT [tetrakis (dimethylamino) titanium], TEMAT [tetrakis (ethylmethylamino) titanium], TDEAT [tetrakis (diethylamino) titanium], $Ti(OiPr)_2(tmhd)_2$[bis(isopropoxy) di(2,2,6,6-tetramethyl-3,5-heptane dionato) titanium], $Ti(OiBu)_2(tmhd)_2$[di(tert-butoxy) bis(2,2,6,6-tetramethyl-3,5-heptane dionato) titanium], $Ti(OiBu)_4$[titanium(VI) tert-butoxide], TTIP [titanium (IV) isopropoxide], and $TiCl_4$[titanium tetrachloride].

8. The method of claim 1, wherein the forming of the TiN layer comprises:
plasma-processing the substrate formed with the TiCN layer; and
purging,
wherein the plasma-processing of the substrate and the purging are repeated.

9. The method of claim 8, wherein, in the forming of the TiN layer, a plasma-processing time and power are controlled in the plasma-processing of the substrate.

10. The method of claim 9, wherein, in the plasma-processing, a plasma applying gas includes at least one independent gas or a mixed gas of at least two gases selected from the group consisting of $N_2$, Ar, $H_2$, $NH_3$ and He.

11. The method of claim 9, wherein, in the plasma-processing, a power of at least 1,000 W is used.

12. A method for fabricating a capacitor, comprising:
forming a first electrode;
forming a dielectric layer; and
forming a second electrode on the dielectric layer,
wherein at least one of the first and second electrodes includes a TiCN layer and a TiN layer,
wherein the TiN layer is formed by partially changing the TiCN layer into the TiN layer.

13. The method of claim 12, wherein the TiN layer is formed by repeating plasma-processing of a substrate formed with the TiCN layer and purging.

14. The method of claim 13, wherein, in the plasma-processing, a plasma-processing time and power are controlled to control a thickness of the TiN layer.

15. A method for fabricating an electrode of a semiconductor device, comprising:
preparing a substrate;
forming a TiCN layer; and
forming a TiN layer, wherein the TiN layer is stacked on the TiCN layer,
wherein the forming of the TiN layer comprises:
introducing a plasma organic source;
purging;
plasma-processing; and
purging,
wherein the introducing of the plasma organic source, the purging, the plasma-processing and the purging are repeated.

16. The method of claim 15, wherein, in the plasma-processing, a plasma applying gas includes at least one independent gas or a mixed gas of at least two gases selected from the group consisting of $N_2$, Ar, $H_2$, $NH_3$ and He.

17. The method of claim 15, wherein, in the plasma-processing, a power of at least 1,000 W is used.

18. The method of claim 15, wherein the titanium organic source includes at least one selected from the group consisting of TDMAT [tetrakis (dimethylamino) titanium], TEMAT [tetrakis (ethylmethylamino) titanium], TDEAT [tetrakis (diethylamino) titanium], $Ti(OiPr)_2(tmhd)_2$[bis(isopropoxy) di(2,2,6,6-tetramethyl-3,5-heptane dionato) titanium], $Ti(OiBu)_2(tmhd)_2$[di(tert-butoxy) bis(2,2,6,6-tetramethyl-3,5-heptane dionato) titanium], $Ti(OiBu)_4$[titanium(VI) tert-butoxide], TTIP [titanium (IV) isopropoxide], and $TiCl_4$[titanium tetrachloride].

* * * * *